US005282224A

United States Patent [19]

Harada

[11] Patent Number: 5,282,224
[45] Date of Patent: Jan. 25, 1994

[54] SIGNAL PROCESSING INTEGRATED CIRCUIT DEVICE

[75] Inventor: Hiroyuki Harada, Itami, Japan

[73] Assignee: Mitsubishi Denki Kabushiki Kaisha, Tokyo, Japan

[21] Appl. No.: 703,841

[22] Filed: May 21, 1991

[30] Foreign Application Priority Data

Jan. 30, 1991 [JP] Japan .................... 3-9545

[51] Int. Cl.⁵ .................... H04B 3/46; H04B 17/00; H03D 3/22; H03H 7/30
[52] U.S. Cl. .................... 375/10; 375/86; 370/13; 324/76.11; 455/226.1; 381/7
[58] Field of Search .................... 375/10, 86, 115; 370/13; 455/226.1; 324/76 R; 381/7, 31

[56] References Cited

U.S. PATENT DOCUMENTS

| | | | |
|---|---|---|---|
| 3,875,500 | 4/1975 | Fletcher et al. | 375/10 |
| 4,055,808 | 10/1977 | Holsinger et al. | 375/10 |
| 4,219,778 | 7/1980 | Ishii | 455/226.1 |
| 4,500,920 | 2/1985 | Ohyama et al. | 455/226.1 |
| 4,918,623 | 4/1990 | Lockitt et al. | 375/10 |

Primary Examiner—Stephen Chin
Assistant Examiner—Paul Loomis
Attorney, Agent, or Firm—Oblon, Spivak, McClelland, Maier & Neustadt

[57] ABSTRACT

There are provided a modulation circuit (9) and a signal processing circuit (2) on the same chip. The modulation circuit (9) modulates an input signal (30) to apply it to a selector (8). The selector (8) selectively applies to the signal processing circuit (2) either the input signal (30) or a modulated signal (40) in accordance with a select signal (50). The modulation circuit (9) is synchronized with the signal processing circuit (2) by a timing signal (11) from the signal processing circuit (2). For this reason, there is no need of an equipment for synchronizing the signal processing circuit (2) and the modulation circuit (9) in the test. A test signal provided from the exterior need not have been already modulated. Therefore, the test signal can be easily produced and confirmed, and the compression rate of the test signal is improved.

4 Claims, 6 Drawing Sheets

SIGNAL PROCESSING INTEGRATED CIRCUIT DEVICE

BACKGROUND OF THE INVENTION

1. Field of the Invention

The present invention relates to a signal processing integrated circuit device which performs a predetermined processing on an input signal such as a PCM signal and more particularly to a signal processing integrated circuit device which performs a predetermined processing on a modulated input signal.

2. Description of the Background Art

FIG. 1 is a block diagram of a conventional signal processing integrated circuit device. A test is conducted on the signal processing integrated circuit device in a manner described hereinafter. A test signal is inputted from a test signal generator 200 through an input pad 1 to an input part 3 of a signal processing circuit 2. A synchronizer (not shown) synchronizes the test signal generator 200 with the signal processing circuit 2. The signal processing circuit 2 processes the input signal and outputs a signal through an output part 4 and an output pad 5. The output signal is measured, thereby the signal processing integrated circuit device being tested.

Because of high efficiency of the test, the test signal generator 200 is required to be previously programmed such that it generates a test signal in accordance with the signal processing integrated circuit device to be tested. Particularly when the test is conducted on a signal processing integrated circuit device which processes a modulated signal, e.g., a PCM decoder for satellite broadcasting service or a PCM decoder for a compact disc, the test signal generated in the test signal generator 200 must be a modulated signal.

The conventional signal processing integrated circuit device is structured as mentioned above. The modulated signal must be inputted to the signal processing integrated circuit device to be tested for processing the modulated signal. For example, an audio signal processing integrated circuit device for use in a satellite broadcasting service receiver employs digitized audio data and audio signal demodulation information necessary for demodulating the audio data to an analog signal. For accurate reproduction of a data clock on the receiver side (corresponding to the signal processing circuit 2 of FIG. 6), a signal obtained by scrambling both of the data by means of a PN (pseudo noise) signal is used as an input signal. Thus, when the test is conducted on the audio signal processing integrated circuit device for use in the satellite broadcasting service receiver, it is necessary to produce the audio data and the audio signal demodulation information, to scramble both of the data by the PN signal, and to use the scrambled signal as an input signal.

In the test of the signal processing integrated circuit device for processing the modulated signal, it is required to produce signals capable of testing all various characteristics of the signal processing integrated circuit device and to perform a predetermined modulation on the signals. There arises a problem that complicated operations are required.

Another problem is that it is difficult to decide whether or not the generated test signal is normal because the test signal has been modulated. When a signal modulated by a pseudo-random number signal is used as in the satellite broadcasting receiver, the test signal also must be such a modulated signal. Still another problem is that a small number of repetitive data included in the signal causes a low compression rate of the test signal.

In order to solve the problems, there may be provided a modulator for modulating the test signal from the test signal generator 200 to generate a modulated signal in accordance with the signal processing circuit 2, between the test signal generator 200 and the signal processing circuit 2. This structure facilitates the operations of producing the test signal and improves the compression rate of the test signal because of the increase in the repetitive data included in the signal. This structure, however, causes another problem that two other equipments for synchronization are required because the modulator must be synchronized with both the test signal generator 200 and the signal processing circuit 2, respectively.

SUMMARY OF THE INVENTION

According to the present invention, a signal processing integrated circuit device formed on a single chip comprises an input terminal to which an input signal is applied, a signal processing circuit for performing a predetermined processing on a modulated signal applied thereto, a modulation circuit connected to the input terminal and the signal processing circuit and synchronized with the signal processing circuit by a timing signal from the signal processing circuit for modulating the input signal from the input terminal to output the modulated signal in accordance with the signal processing circuit, a selection signal input terminal to which a selection signal is applied, and selection means connected to the selection signal input terminal, the input terminal and the modulation circuit for selectively applying to the signal processing circuit either the input signal or the modulated signal in accordance with the selection signal from the selection signal input terminal.

The modulation circuit according to the present invention modulates the input signal and applies the modulated signal in accordance with the signal processing circuit to the selection means. The selection means selectively outputs either the input signal or the modulated signal in accordance with the selection signal and applies it to the signal processing circuit. The modulation circuit and the signal processing circuit are provided on the same chip, so that the modulation circuit can be synchronized with the signal processing circuit by means of the timing signal of the signal processing circuit.

According to the present invention, the modulation circuit and the selection means are provided on a single chip. The modulation circuit, which is synchronized with the signal processing circuit by the timing signal from the signal processing circuit, modulates the input signal from the input terminal and outputs the modulated signal in accordance with the signal processing circuit. The selection means selectively applies either the input signal or the modulated signal in accordance with the selection signal to the signal processing circuit. Therefore, the modulation circuit can be synchronized with the signal processing circuit by means of the timing signal of the signal processing circuit. As a result, unnecessary is an equipment for synchronizing the signal processing circuit and the modulation circuit in the test of the signal processing integrated circuit device. Since there is no need for generating the modulated test signal, the operations of generating the test signal are facilitated. The test signal, which has not yet been modulated, can be easily confirmed, and the compression rate of the test signal can be increased.

An object of the present invention is to provide a signal processing integrated circuit device, with a smaller number of equipments for synchronization, capable of easily producing and confirming a test signal and having a high compression rate of the test signal, when a test is conducted on the signal processing integrated circuit device for processing a modulated signal.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
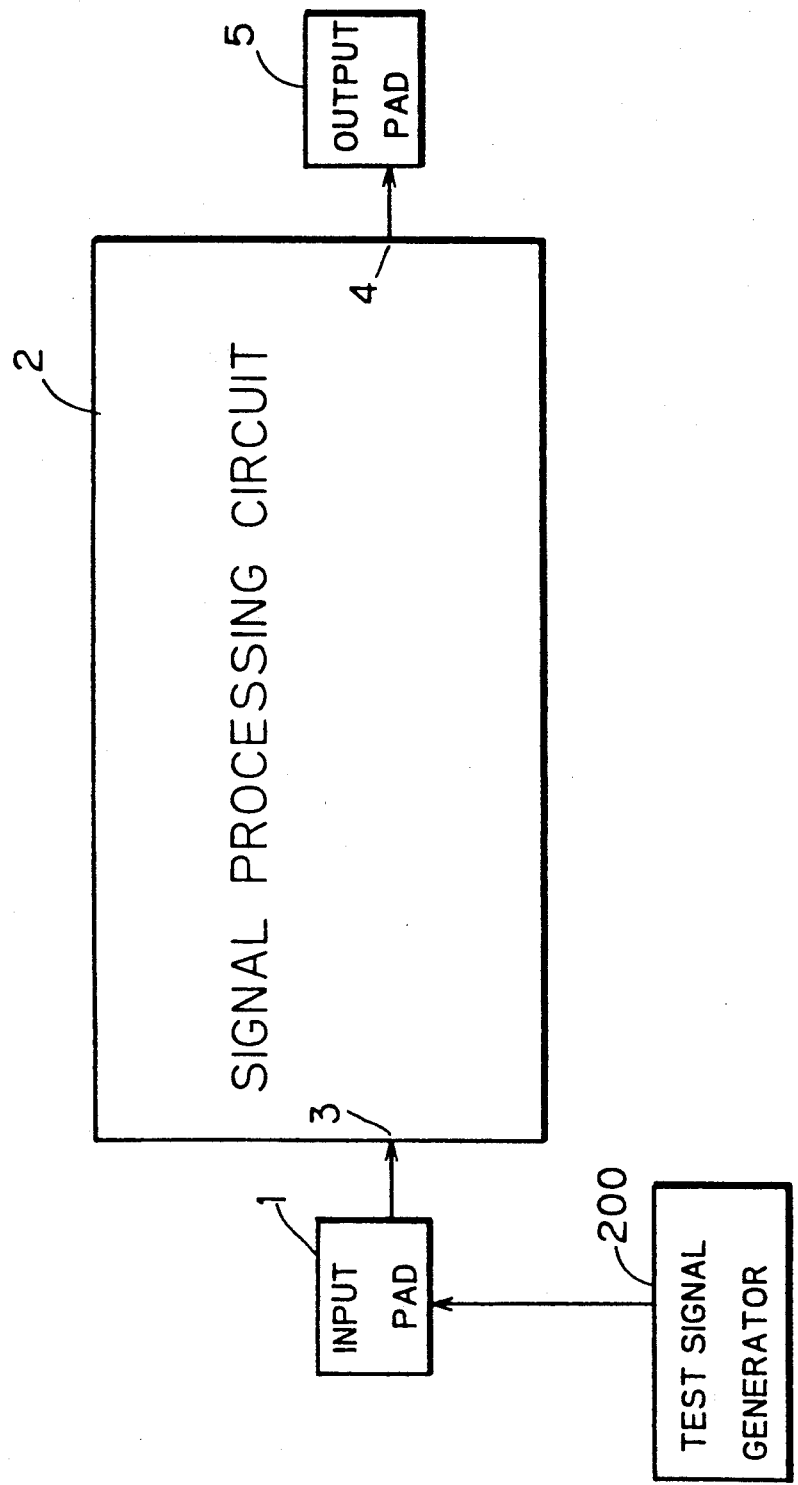
FIG. 1 is a block diagram showing a conventional signal processing integrated circuit device.
Figure 2:
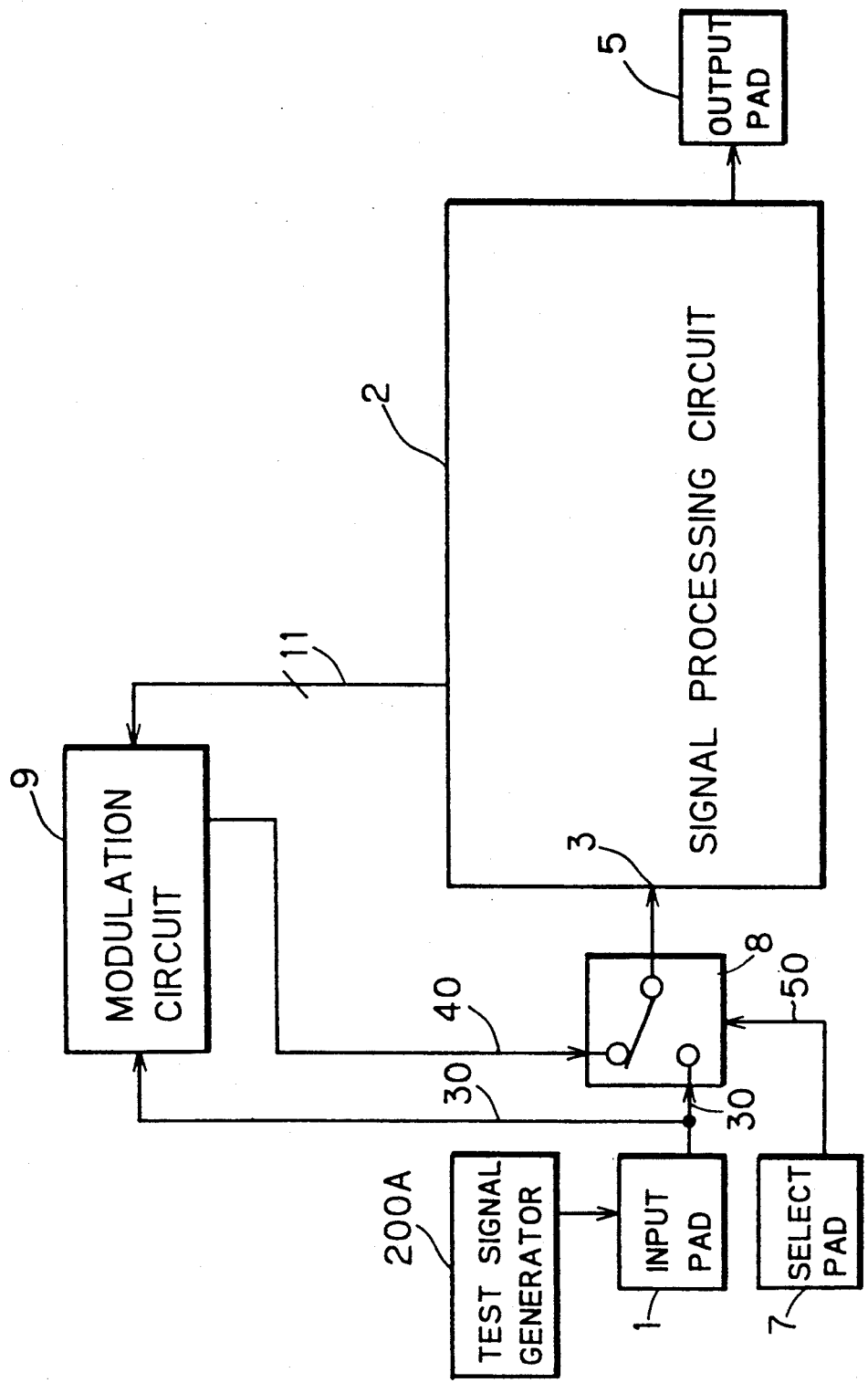
FIG. 2 is a block diagram showing an embodiment of a signal processing integrated circuit device according to the present invention.

FIG. 2 is a block diagram showing an embodiment of a signal processing integrated circuit device according to the present invention. This embodiment is different from the conventional signal processing integrated circuit device of FIG. 2 in that a select pad 7, a selector 8 and a modulation circuit 9 are newly provided and the signal processing circuit 2, the selector 8, the modulation circuit 9 and the respective pads 1, 5 and 7 are provided on a single chip. A select signal 50 is inputted from the exterior of the chip through the select pad 7 to the selector 8, to which an input signal 30 is also inputted from the exterior of the chip through the input pad 1. The modulation circuit 9 modulates the input signal 30 from the input pad 1 and sends to the selector 8 a modulated signal 40 in accordance with the signal processing circuit 2. A timing signal 11 which utilizes a clock of the signal processing circuit 2 is applied to the modulation circuit 9. The timing signal 11 synchronizes the modulation circuit 9 with the signal processing circuit 2. The selector 8 is switched in accordance with the select signal 50 and applies to the signal processing circuit 2 either the input signal 30 or the modulated signal 40 selectively.

Figure 3:
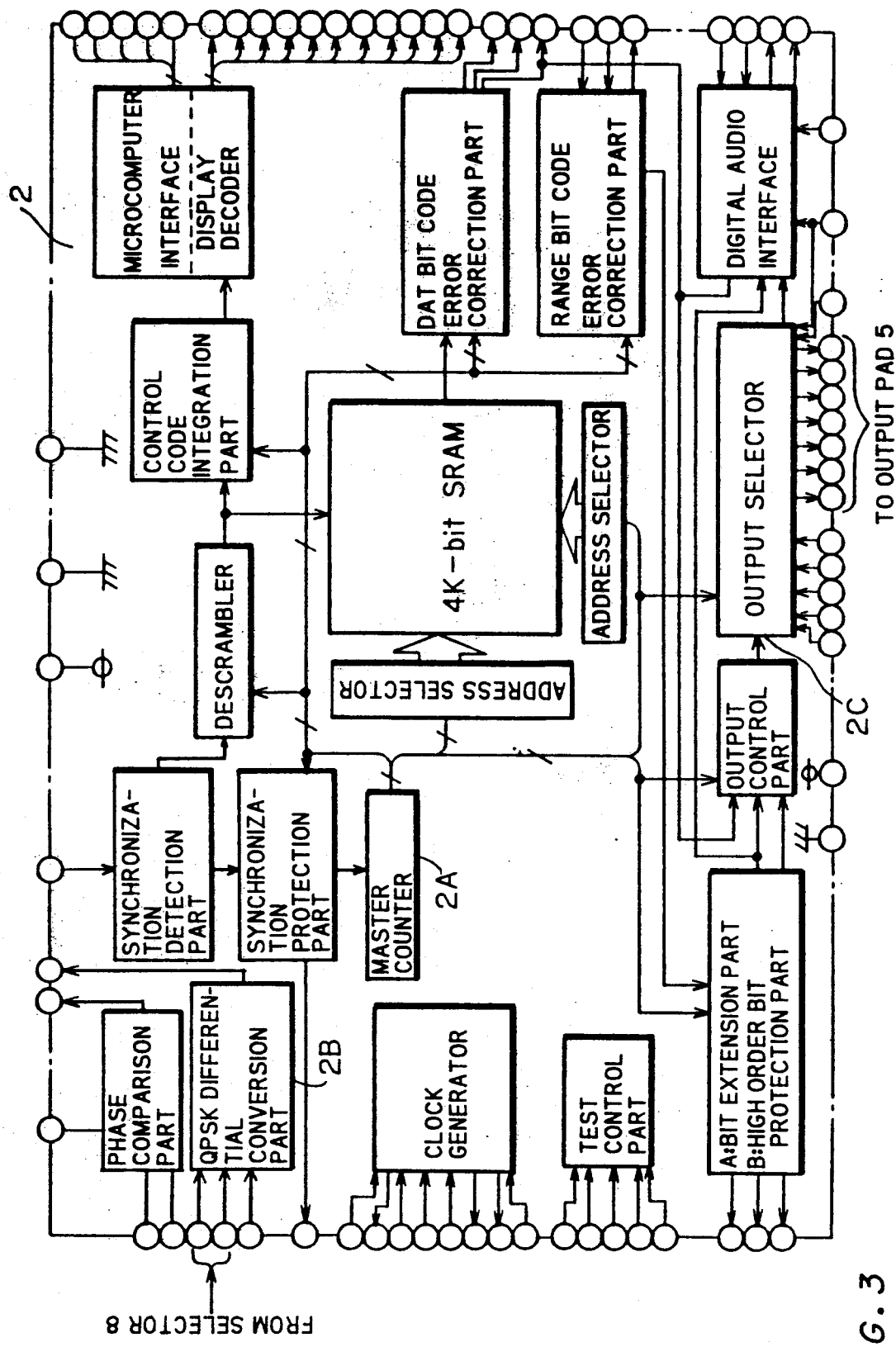
FIG. 3 is a block diagram showing a signal processing circuit.

FIG. 3 is a block diagram showing an example of the signal processing circuit 2 disclosed in "MITSUBISHI DENKI 1990 Semiconductor Data Book AV Part". The signal processing circuit 2 of FIG. 3 is an audio signal processing circuit for receiving satellite broadcasting service.

Figure 4:
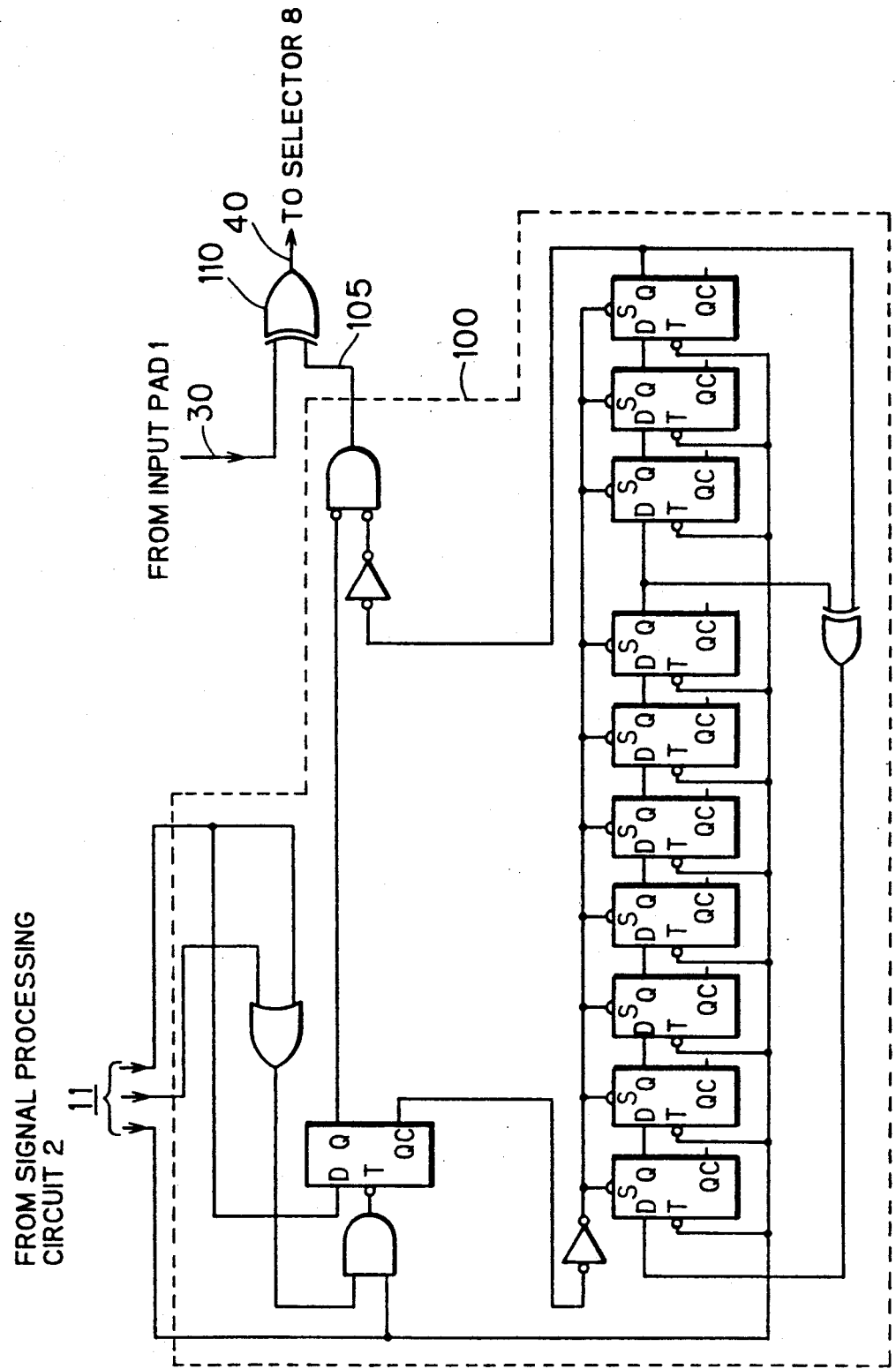
FIG. 4 is a circuit diagram showing a modulation circuit.

FIG. 4 is a circuit diagram showing an example of the modulation circuit 9. This circuit is a modulation circuit for use in the audio signal processing circuit for receiving satellite broadcasting service shown in FIG. 3 (hereinafter referred to as a satellite modulation circuit). The satellite modulation circuit is previously designed to generate a modulated signal to be processed by the audio signal processing circuit for receiving satellite broadcasting service. The satellite modulation circuit comprises a PN signal generation circuit 100 and an exclusive OR gate 110. The input signal 30 from the input pad 1 is applied to one input terminal of the exclusive OR gate 110, and a PN signal 105 from the PN signal generation circuit 100 is applied to the other input terminal thereof. The structure of the PN signal generation circuit 100 is commonly known. That is, the PN signal generation circuit 100 comprises various logic gates (i.e., an AND gate, an exclusive OR gate, an OR gate and a negative logic inverter) and shift registers. The timing signal 11 (composed of three signals) for synchronization with the signal processing circuit 2 is inputted to the PN signal generation circuit 100. Two of them are generated by decoding the count value of a master counter 2A in the circuit of FIG. 3. The other is generated by means of a reference clock counted by the master counter 2A. In accordance with the combination of the three signals composing the timing signal 11, "φ" is, for example, inputted to an S terminal of each of the shift resisters, and the respective shift resisters are set. The PN signal 105 is generated in accordance with the combination of the three signals composing the timing signal 11. The PN signal 105 is applied to one input terminal of the exclusive OR gate 110. The input signal 30 (digitized audio data and audio signal demodulation information) is applied to the other input terminal of the exclusive OR gate 110 from the input pad 1. The exclusive OR gate 110 sends to the selector B the exclusive OR of the input signal 30 and the PN signal 105. The exclusive OR is provided by scrambling the audio data and the audio signal demodulation information by the PN signal 105.

Figure 5:
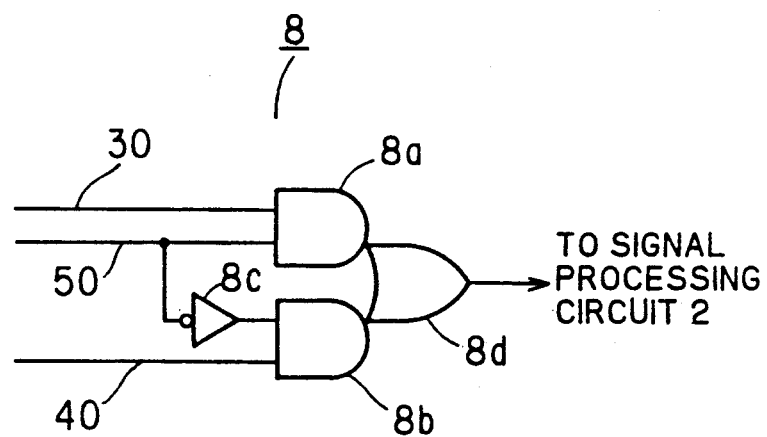
FIG. 5 is a block diagram showing an embodiment of a selector according to the present invention.

FIG. 5 is a block diagram showing an embodiment of the selector 8. The selector 8 comprises AND gates 8a and 8b, an inverter 8c and an OR gate 8d. The input signal 30 from the input pad 1 is applied to one input terminal of the AND gate 8a, and the select signal 50 is applied to the other input terminal thereof. The modulated signal 40 from the modulation circuit 9 is applied to one input terminal of the AND gate 8b, and an inversion signal of the select signal 50 is applied to the other input terminal thereof through the inverter 8c. The AND gates 8a and 8b selectively output either the input signal or the modulated signal in accordance with the select signal 50. Both of the outputs from the AND gates 8a and 8b are inputted to the OR gate 8d. The OR gate 8d outputs the OR of the outputs from the AND gates 8a and 8b. The output from the OR gate 8d is inputted to the signal processing circuit 2.

The operation of the signal processing integrated circuit device is described hereinafter. In a normal mode, the selector 8 is switched to the side of the input pad 1 (or the input signal 30) by the select signal 50 which is inputted from the select pad 7. The select signal 50 at an "H" level is inputted from the select pad 7 so that the input signal 30 is outputted from the OR gate 8d in FIG. 5. The input signal 30 is inputted to a QPSK differential conversion part 2B. The audio signal processing circuit 2 for receiving satellite broadcasting service performs a predetermined processing on the input signal 30. The processed input signal 30 is outputted through an output selector 2C and the output pad 5.

In a test mode, the selector 8 is switched to the side of the modulation circuit 9 by the select signal 50. The select signal 50 at an "L" level is inputted from the select pad 7 so that the modulated signal 40 is outputted from the OR gate 8d in FIG. 5. The test signal from a test signal generator 200A is applied through the input pad 1 to the modulation circuit 9. The modulation circuit 9 modulates the applied test signal in accordance with the signal processing circuit 2 and outputs the modulated signal 40. The modulated signal 40 is inputted from the selector 8 to the signal processing circuit 2. The modulated signal 40 is inputted to the QPSK differential conversion part 2B. The audio signal processing circuit 2 for receiving satellite broadcasting service performs a predetermined processing on the modulated signal 40. The processed modulated signal 40 is outputted through an output selector 2C and the output pad 5. The signal from the output pad 5 is measured, thereby the audio signal processing circuit 2 for receiving satellite broadcasting service being tested.

As describe above, the modulation circuit 9 and the signal processing circuit 2 are provided on the same chip, and the modulation circuit 9 is synchronized with the signal processing circuit 2 by means of the clocks generated by the signal processing circuit 2 (or the clock provided by decoding the output from the master counter 2A and the reference clock counted by the master counter 2A in FIG. 3). Therefore, the equipment for synchronization should be provided only between the test signal generator 200A and the modulation circuit 9, and resultingly the number of equipments for synchronization is reduced. The modulation circuit 9 is previously designed to generate the modulated signal in accordance with the signal processing circuit 2, and is formed on the same chip as the signal processing circuit 2 is. The test signal generated in the test signal generator 200A need not to the modulation. As a result, the test signal is easily generated and confirmed, and the operations in the test are facilitated. When the test is conducted on the audio signal processing integrated circuit device for receiving satellite broadcasting service for processing the signal modulated by a random number signal, the test signal before modulation may be used, so that the compression rate of the signal is improved.

Figure 6:
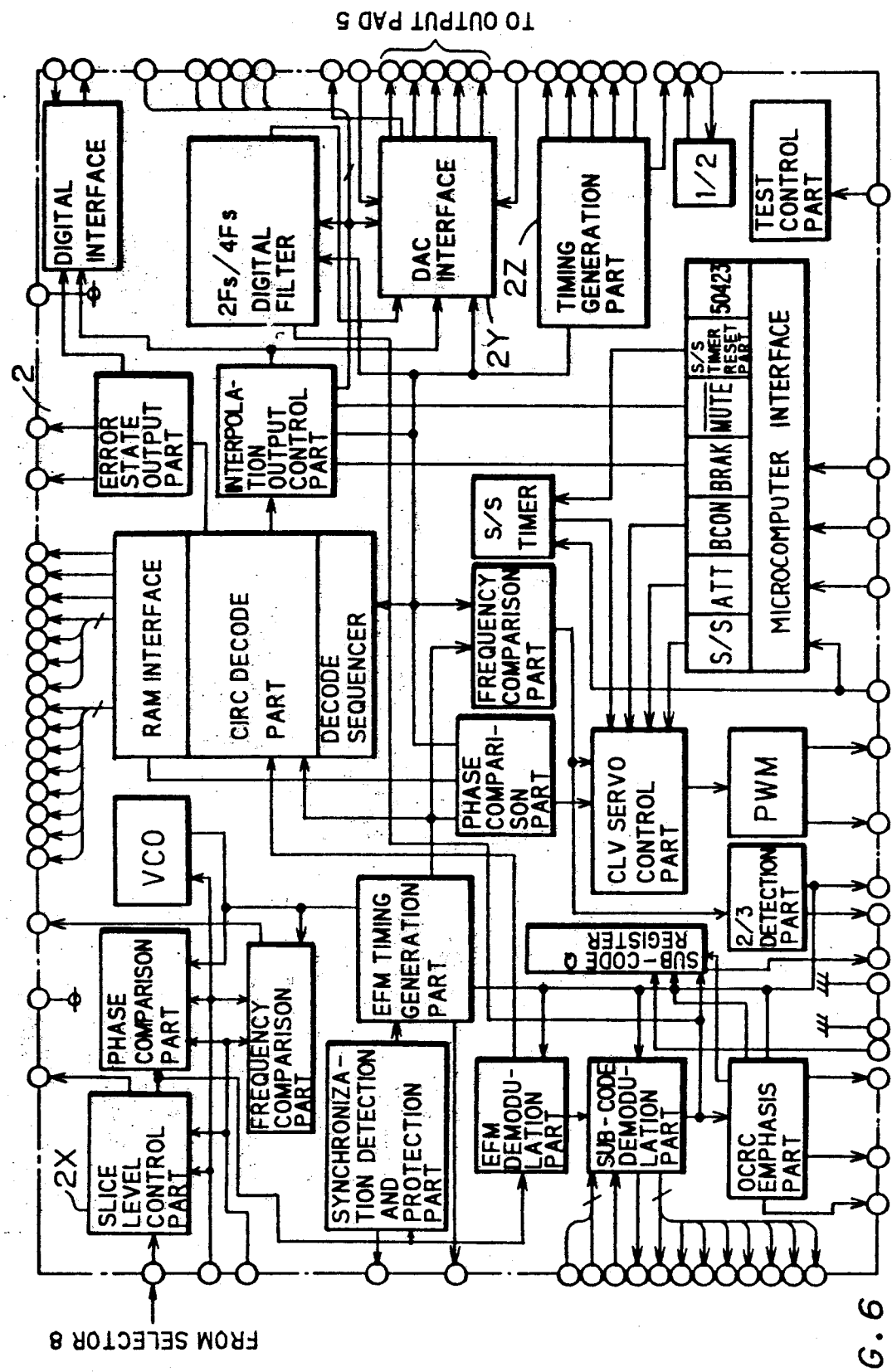
FIG. 6 is a block diagram showing another signal processing circuit.

FIG. 6 is a block diagram showing another signal processing circuit 2, which is disclosed also in "MITSUBISHI DENKI 1990 Semiconductor Data Book AV Part". The signal processing circuit of FIG. 6 is an audio signal processing circuit for a CD reproducer. The input signal 30 or the modulated signal 40 from the selector 8 is inputted to a slice level control part 2X. The inputted signal is subjected to a predetermined processing and is outputted from a DAC interface 2Y. The timing signal 11 is generated by decoding the signals from a timing generation part 2Z. When the signal processing circuit 2 is the audio signal processing circuit for a CD reproducer, the modulation circuit 9 is required to be changed into a circuit for generating a modulated signal in accordance with the signal processing circuit 2.

In the above-mentioned preferred embodiment, a single input signal 40 and a single output signal are used. That is, there are provided a single input pad 1, single input and output parts of the signal processing circuit 2, single input and output parts of the modulation circuit 9 and a single output pad 5, respectively. The number of input and output signals is, however, arbitrary. The structure of the selector 8 is not limited to that of FIG. 5. Any structure is applicable only if the input signal 30 or the modulated signal 40 can be selectively outputted in accordance with the select signal 50. The form of the select signal is arbitrary.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A signal processing integrated circuit device formed on a single chip, comprising:
    an input terminal to which an input signal is applied;
    a signal processing circuit for performing a predetermined processing on a modulated signal applied thereto;
    a modulation circuit connected to said input terminal and said signal processing circuit for modulating said input signal from said input terminal to output the modulated signal in accordance with said signal processing circuit, said modulation circuit being synchronized with said signal processing circuit by a timing signal from said signal processing circuit;
    a selection signal input terminal to which a selection signal is applied; and
    selection means connected to said selection signal input terminal, said input terminal and said modulation circuit for selectively applying to said signal processing circuit either said input signal or said modulated signal in accordance with said selection signal from said selection signal input terminal,
    wherein said signal processing circuit is an audio signal processing circuit for receiving satellite broadcasting services which includes a QPSK differential conversion part receiving said input signal from said input terminal or said modulating signal from said modulation circuit through said selection means, a master counter for counting a reference clock to derive said timing signal, and an output selector for selecting and outputting output signals under control of an output control means.

2. A signal processing integrated circuit device formed on a single chip, comprising:
    an input terminal to which an input signal is applied;
    a signal processing circuit for performing a predetermined processing on a modulated signal applied thereto;
    a modulation circuit connected to said input terminal and said signal processing circuit for modulating said input signal from said input terminal to output the modulated signal in accordance with said signal processing circuit, said modulation circuit being synchronized with said signal processing circuit by a timing signal from said signal processing circuit;
    a selection signal input terminal to which a selection signal is applied; and
    selection means connected to said selection signal input terminal, said input terminal and said modulation circuit for selectively applying to said signal processing circuit either said input signal or said modulated signal in accordance with said selection signal from said selection signal input terminal,
    wherein said signal processing circuit is an audio signal processing circuit for a CD reproducer which includes a slice level control part receiving said input signal from said input terminal or said modulated signal from said modulation circuit through said selection means, a DAC interface through which an output signal is outputted, and a timing generation part for deriving said timing signal.

3. A signal processing integrated circuit device in accordance with claim 1, wherein said modulation circuit comprises an exclusive OR gate having a first input terminal connected to said input terminal; and a pseudo noise signal generating circuit having an input terminal connected to said output selector and an output terminal connected to a second input terminal of said exclusive OR gate.

4. A signal processing integrated circuit device formed on a single chip, comprising:

an input terminal to which an input signal is applied;

a signal processing circuit for performing a predetermined processing on a modulated signal applied thereto;

a modulation circuit connected to said input terminal and said signal processing circuit for modulating said input signal from said input terminal to output the modulated signal in accordance with said signal processing circuit, said modulation circuit being synchronized with said signal processing circuit by a timing signal from said signal processing circuit;

a selection signal input terminal to which a selection signal is applied; and selection means connected to said selection signal input terminal, said input terminal and said modulation circuit for selectively applying to said signal processing circuit either said input signal or said modulated signal in accordance with said selection signal from said selection signal input terminal, wherein said selection means comprises:

a first AND gate having a first input terminal connected to said input terminal and a second input terminal connected to said selection signal input terminal, an inverter, a second AND gate having a first input terminal connected to said selection signal input terminal through said inverter and a second input terminal connected to said modulation circuit, and an OR gate having first and second input terminals connected with output terminals of said first and second AND gates, respectively, and an output terminal connected with said signal processing circuit.

* * * * *